United States Patent [19]
Na et al.

[11] Patent Number: 6,157,238
[45] Date of Patent: Dec. 5, 2000

[54] CLOCK SYSTEM OF A SEMICONDUCTOR MEMORY DEVICE EMPLOYING A FREQUENCY AMPLIFIER

[75] Inventors: Kwang Jin Na; Seong Ik Cho, both of Ichon-shi, Rep. of Korea

[73] Assignee: Hyundai Electronics Industries Co., Ltd., Ichon-shi, Rep. of Korea

[21] Appl. No.: 09/104,987

[22] Filed: Jun. 26, 1998

[30] Foreign Application Priority Data

Jun. 30, 1997 [KR] Rep. of Korea ..................... 97-30208

[51] Int. Cl.⁷ ....................................... H03K 3/00
[52] U.S. Cl. ........................... 327/297; 327/175; 331/60; 365/233
[58] Field of Search ..................... 327/116, 119, 327/120, 121, 122, 269, 271, 141, 152, 291, 292, 295, 297, 172–176; 377/47, 48; 331/2, 45–56, 60; 326/93; 365/233, 233.5

[56] References Cited

U.S. PATENT DOCUMENTS 5,530,387  6/1996  Kim ....................................... 327/119
5,565,816  10/1996  Coteus ....................................... 331/2
5,666,322  9/1997  Conkle ....................................... 365/233

*Primary Examiner*—Kenneth B. Wells
*Assistant Examiner*—Minh Nguyen
*Attorney, Agent, or Firm*—Jacobson, Price, Holman & Stern, PLLC

[57] ABSTRACT

A clock system produces a high-speed clock signal based on a low-speed clock signal inputted from the outside through the use of a frequency amplifier therein in order to thereby reduce power consumption at a clock buffer. In order to perform the above process, the clock system is composed of an external clock source for producing a clock signal having a frequency of f, a plurality of Rambus DRAMs and a controller, which are synchronized by the clock signal derived from the external clock source. By using the clock system, it is possible to reduce power consumption at the clock buffer and to decrease occurrence of a high frequency noise at a clock pin, and thus, a high qualified system design is also accomplished.

5 Claims, 2 Drawing Sheets

CLOCK SYSTEM OF A SEMICONDUCTOR MEMORY DEVICE EMPLOYING A FREQUENCY AMPLIFIER

FIELD OF THE INVENTION

The present invention relates to a high-speed clock system employing a frequency amplifier; and, more particularly, to a clock system of a semiconductor memory which produces a high-speed clock signal based on a low-speed clock signal inputted from outside through the use of a frequency amplifier therein.

DESCRIPTION OF THE PRIOR ART

In conventional clock systems, a clock signal, which is generated by a high-speed clock source located outside the device, is coupled with the device. Therefore, The clock buffer in the device suffers from high power consumption in order to perform a full swing of the high-speed clock signal inputted from outside the device. Furthermore, there is a problem in that a high frequency noise is induced at a clock pad(or a clock pin) of the device.

At a board level, as a clock speed increases, various schemes such as a scheme decreasing the swing width of a clock signal and a scheme using a reference voltage have been utilized. However, these schemes require higher costs and an advanced board design technique.

Referring to FIG. 1, there is provided a subsystem of a conventional Rambus DRAM composed of an external clock source 10 for producing a clock signal having a frequency of f, a plurality of Rambus DRAMs 20 and 30 and a controller 40. The operations of the Rambus DRAMs 20 and 30 and the controller 40 are synchronized by the clock signal provided by the external clock source 10.

The Rambus DRAMs 20 and 30 and the controller 40 employ delay locked loop(DLL) circuits 45, 55 and 65, respectively, therein. Each DLL circuit performs the synchronization between external clock signals Txclk and Rxclk fed thereto from outside and inner clock signals TCK and RCK, and compensates 50% duty.

Since a specific clock standard which decreases a full swing voltage level is used in order to stabilize the Txclk and Rxclk in several hundred MHz, it can induce difficulty in a board design.

In addition, since each of the DLL circuits 45, 55 and 65 includes a clock amplifier therein so as to convert an external high-speed clock signal having a narrow swing width to a clock signal having a full swing reaching a source voltage, high power consumption will be required.

SUMMARY OF THE INVENTION

It is, therefore, the primary object of the present invention to provide a clock system for producing a high-speed clock signal based on a low-speed clock signal inputted from outside through the use of an inner frequency amplifier to thereby reduce power consumption at a clock buffer.

In accordance with the present invention, there is provided a high-speed clock system comprising: a frequency amplifier for amplifying an external clock signal provided by an external clock source located outside the semiconductor memory device to thereby produce an inner clock signal whose frequency is M multiples of that of the external clock signal, wherein M is a positive integer; a clock compensation circuit for synchronizing a phase of the inner clock signal; and a multiplicity of devices whose operations are synchronized by the inner clock signal.

BRIEF DESCRIPTION OF THE DRAWINGS

The objects, features, and advantages of the present invention will become apparent from the following detailed description of preferred embodiments of the invention with reference to the accompanying drawings, in which.

DETAILED DESCRIPTION OF THE PREFERRED EMBODIMENTS

The embodiment of the present invention will be illustrated in detail with reference to the accompanying drawings.

Figure 1:
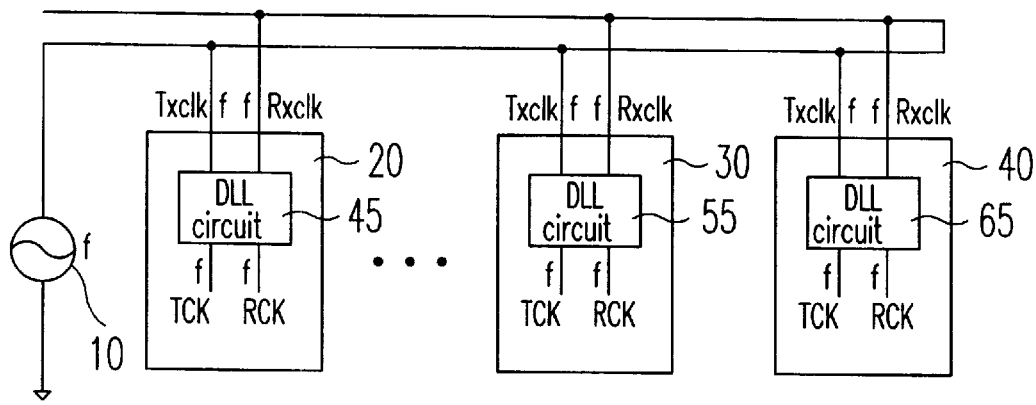
FIG. 1 represents a subsystem of a conventional Rambus DRAM.
Figure 2:
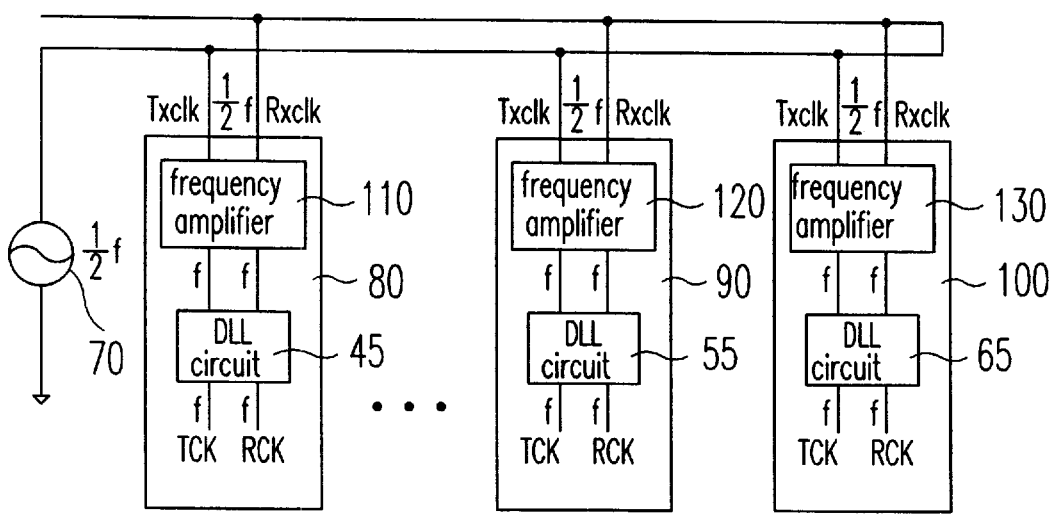
FIG. 2 shows a high-speed clock system employing a frequency amplifier in accordance with an embodiment of the present invention.

Referring to FIG. 2, there is provided a clock system of a semiconductor memory device employing a frequency amplifier in accordance with the embodiment of the present invention. The clock system basically comprises an external clock source 70 having a frequency clock of f/2 compared with the external clock source 10, having a frequency clock of f, in FIG. 1, a multiplicity of Rambus DRAMs 80 and 90 and a controller 100. The Rambus DRAMs 80 and 90 and the controller 100 contain frequency amplifiers 110, 120 and 130, respectively, and their operations are synchronized by clock signals generated from the external clock source 70.

Each of the frequency amplifiers 110, 120 and 130 amplifies the clock signals having a frequency of f/2, which is generated from the external clock source 70, to thereby produce clock signals having a frequency of f, and the frequency amplifiers have an identical structure.

Figure 3:
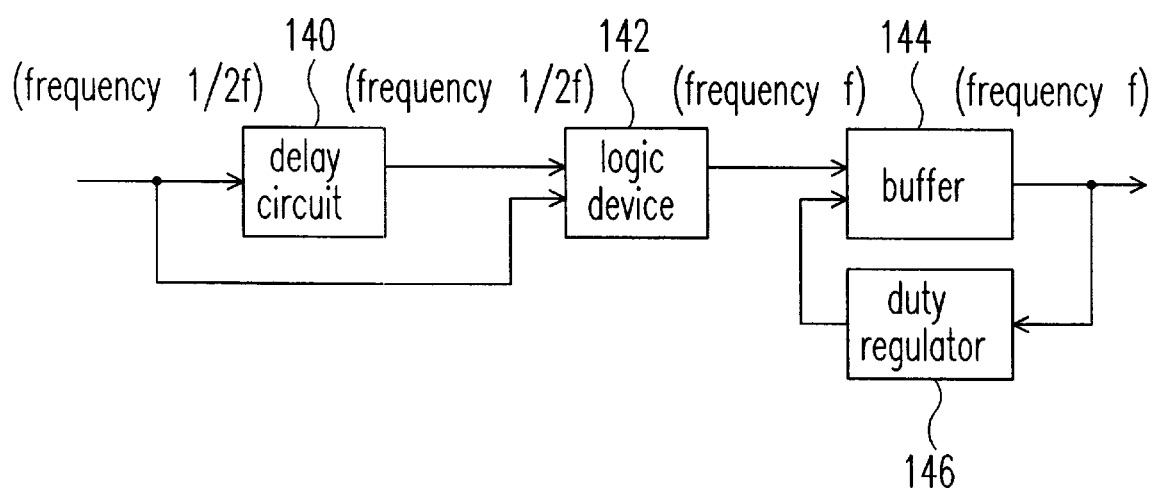
FIG. 3 provides a block diagram of the frequency amplifier within the clock system in FIG. 2.

Referring to FIG. 3, there is provided a block diagram of each of the frequency amplifiers 110, 120 and 130 including a delay circuit 140, a logic device 142, a buffer 144 and a duty regulator 146.

The clock signal having a frequency of f/2 provided from the external clock source 70 is coupled to the delay circuit 140 and the logic device 142.

The delay circuit 140 produces a phase-delayed clock signal by delaying the clock signal having a frequency of f/2 fed thereto and provides the delayed clock signal to the logic device 142.

The logic device 142 generates a clock signal having a frequency of f by logically processing the clock signal having a frequency of f/2 and the phase-delayed clock signal through the use of an exclusive-OR gate and outputs the clock signal having a frequency of f to the buffer 144.

The buffer 144 adjusts a duty ratio of the clock signal having a frequency of f, generated from the logic device 142, by 50% by using a compensation voltage which is produced at the duty regulator 146 and proportional to a duty error.

The duty regulator 146 estimates the duty ratio of the clock signal fed back from the buffer 144 and provides the compensation voltage generated depending on the duty error to the buffer 144.

Referring back to FIG. 2, the multiplicity of Rambus DRAMs 80 and 90 and the controller 100 employ DLL circuits therein, respectively, wherein each of the DLL circuits has the same construction as the conventional DLL circuit in the prior art.

The duty regulator 146 can be embodied by using a duty regulation circuit(not shown) in the DLL circuit within the Rambus DRAM.

Hereinafter, the operation of a clock generation apparatus of a semiconductor memory device in accordance with the embodiment of the present invention will be illustrated.

First of all, if an external clock signal having a frequency of f/2 is coupled to each of the Rambus DRAMs 80 and 90 and the controller 100, each of the inner frequency amplifiers 110, 120 and 130 amplifies the external clock signal fed thereto to thereby generate an operating clock signal having a frequency of f. The operating clock signals generated from the inner frequency amplifiers 110, 120 and 130 are inputted to their corresponding DLL circuits 45, 55 and 65, respectively, and each of the DLL circuits 45, 55 and 65 generates inner clock signals TCK and RCK which have a frequency of f and are synchronized by the external clock signals Txclk and Rxclk, respectively. Through the use of the frequency amplifiers 110, 120 and 130 and the DLL circuits 45, 55 and 65, a clock signal having a duty ratio of 50% is generated.

Consequently, all of devices, i.e., the Rambus DRAMs 80 and 90 and the controller 100, receiving the external clock signal having a frequency of f/2 can be activated by the inner clock signals having a frequency of f generated based on the external clock signal as shown above.

Therefore, in accordance with the embodiment of the present invention, although the high-speed clock system of the present invention employs the external clock source producing a clock signal having a frequency of f/2, it can perform the same operation as the conventional system which is activated by the external clock signal having a frequency of f.

As illustrated above, in accordance with the present invention, since a high clock operation is accomplished in a device by using a low-speed external clock source, it is possible to reduce the power consumption due to the clock buffer in the device. It is also possible to design an advanced system by reducing a high frequency noise due to a device pin at the board level.

Furthermore, there is no need to use a specific clock scheme in order to perform a high-speed clock generation at the board design; the board can be readily designed by reducing the possibility of inducing the high frequency noise; and the cost of manufacturing a PCB board can be cut down. While the present invention has been described with respect to the particular embodiments, it will be apparent to those skilled in the art that various changes and modifications may be made without departing from the spirit and scope of the invention as defined in the following claims. For instance, although only one frequency amplifier is used in the embodiment of the present invention, the high-speed clock system can accomplish its operation through the use of a lower frequency clock source by employing more than one frequency amplifier.

The clock system of the present invention can be effectively applied to any system including a device utilizing a high-speed clock signal as well as a memory subsystem such as the above Rambus DRAM.

What is claimed is:

1. A clock system of a semiconductor memory device comprising:

an external clock source located outside the semiconductor memory device for generating an external clock signal;

a controller synchronized to the external clock signal, said controller containing a master frequency amplifier and a master DLL circuit; and a multiplicity of DRAMs synchronized to the external clock signal, each of said multiplicity of DRAMs containing a frequency amplifier and a DLL circuit;

wherein each of said frequency amplifiers amplify the external clock signal to thereby produce an inner clock signal whose frequency is two multiples of that of the external clock signal, each frequency amplifier including, a delay circuit coupled to said external clock source for producing a phase-delayed clock signal based on the external clock signal;

a logic device coupled to said delay circuit for generating the inner clock signal based on the external clock signal and the phase-delayed clock signal;

a buffer coupled to said logic device for buffering the inner clock signal and providing a buffered clock signal.

2. The clock system according to claim 1, wherein each of said frequency amplifiers further include:

a duty regulator coupled to said buffer for regulating a duty ratio for the buffered clock signal.

3. A clock system of a semiconductor memory device for producing a high-speed clock signal based on a low-speed clock signal, comprising:

an external clock source located outside the semiconductor memory device for generating an external clock signal having a frequency of f/2;

a controller synchronized to the external clock signal, said controller containing a master DLL circuit and a master frequency amplifier for amplifying the external clock signal to produce an inner clock signal having a frequency of f; and a multiplicity of DRAMs synchronized to the external clock signal, each of said multiplicity of DRAMs containing a DLL circuit and a frequency amplifier for amplifying the external clock signal to produce an inner clock signal having a frequency of f, each of said frequency amplifiers including, a delay circuit coupled to said external clock source for producing a phase-delayed clock signal based on the external clock signal;

a logic device coupled to said delay circuit for processing the external clock signal and the phase-delayed clock signal using an exclusive-OR gate to generate the inner clock signal; and a buffer coupled to said logic device for buffering the inner clock signal and providing a buffered clock signal.

4. The clock system as set forth in claim 3, further comprising a duty regulator for providing the buffer with a compensation voltage proportional to a duty error for adjusting the duty ratio of the inner clock signal.

5. The clock system as set forth in claim 3, wherein the buffer receives from the DRAMs a compensation voltage proportional to a duty error for adjusting the duty ratio of the inner clock signal.

* * * * *